United States Patent [19]

Strong

[11] Patent Number: 5,250,858
[45] Date of Patent: Oct. 5, 1993

[54] DOUBLE-EDGE TRIGGERED MEMORY DEVICE AND SYSTEM

[75] Inventor: Richard M. Strong, Pittsburgh, Mass.

[73] Assignee: VLSI Technology, Inc., San Jose, Calif.

[21] Appl. No.: 838,625

[22] Filed: Feb. 19, 1992

[51] Int. Cl.$^5$ .......................................... H03K 19/177
[52] U.S. Cl. .................................... 307/465; 307/443; 307/272.1
[58] Field of Search ................ 307/443, 465, 468-469, 307/480, 243, 272.1; 365/233

[56] References Cited

U.S. PATENT DOCUMENTS

| | | | |
|---|---|---|---|
| 4,629,909 | 12/1986 | Cameron | 307/272.1 |
| 4,663,545 | 5/1987 | Pumo et al. | 307/443 X |
| 4,786,829 | 11/1988 | Letcher | 307/465 |
| 4,807,266 | 2/1989 | Taylor | 307/272.1 X |
| 4,896,054 | 1/1990 | Kiley | 307/272.1 |
| 4,922,457 | 5/1990 | Mizukami | 365/233 X |
| 4,970,418 | 11/1990 | Masterson | 365/233 X |
| 4,980,577 | 12/1990 | Baxter | 307/272.1 |

*Primary Examiner*—David R. Hudspeth
*Attorney, Agent, or Firm*—Fliesler, Dubb, Meyer & Lovejoy

[57] ABSTRACT

A synchronous machine uses a double-edge triggered memory cell which updates its output on both the rising and falling edges of a clock input.

13 Claims, 4 Drawing Sheets

DOUBLE-EDGE TRIGGERED MEMORY DEVICE AND SYSTEM

BACKGROUND

1. Field of the Invention

The invention relates to digital electronic circuits, and more particularly, to synchronous circuits in which logic states are updated periodically in response to a clock signal.

2. Description of Related Art

Digital circuits are often designed for a synchronous operation. That is, they are intended to be used with a clock signal, and every time an effective edge of the clock signal occurs, the values on the outputs of the circuit are updated. The effective edge may be defined as the rising edge of the clock signal for some systems, and in other systems it may be defined as the falling edge.

Synchronous logic circuits are made up of data storage elements and combinational logic elements. The data storage elements may be any of a variety of different types of flip-flops such as D flip-flops, JK flip-flops and clocked T flip-flops. In a D flip-flop, the output is updated to equal the value which is on the D input at the time that the effective edge of the clock pulse arrives. In a JK flip-flop, the output is updated in response to the values on the J and K inputs at the time the effective edge of the clock pulse arrives, according to the following rules: If $J=0$ and $K=0$, the output remains unchanged; if $J=1$ and $K=1$, the output compliments; if $J \neq K$, the output is updated to match the value on the J input. In a clocked T flip-flop, the output remains unchanged if the T input is 0 when the effective edge of the clock pulse arrives, and toggles if the T input is high when the effective edge of the clock pulse arrives. Other types of flip-flops may also be used, and different types of flip-flops may be used in the same system.

The synchronous design philosophy for digital circuits has been generalized and formalized into what is known as the state machine model. In this model, all storage elements in a machine (which may make up part or all of a larger apparatus) are thought of as forming a "present state vector" describing the state of the machine at any given time. More specifically, assuming each storage element stores and outputs a single bit of information, the values on the outputs of all the storage elements form the present state vector of the machine being modeled.

Also in the state machine model, each storage element has one or more data inputs. A D-type storage element, for example, has only one data input, whereas a JK-type storage element has two (J and K).

The state machine model also contains "next state" circuitry, which generates a "next state vector", for applying to the storage elements. The next state circuitry or logic is a purely combinational logic circuit which generates the next state vector outputs as a purely combinational function of one or more elements of the present state vector and/or one or more separate inputs to the machine. Each output of the combinational circuitry is connected to a respective one of the inputs of the storage cells. As used herein, the "next state vector" is made up of the set of values applied to the inputs of the storage cells, even if two or more of the next state vector values are applied to each storage cell (as in the case of JK storage cells). Also as used herein, the term "combinational" can refer to a circuit as simple as a conductor or as complex as a many-level sequence of logic gates. In the state machine model, the outputs of the machine are also generated by the combinational logic circuitry as a function of the present state and/or the separate input signals. Since the term "combinational" includes a simple conductor, this model includes machines in which the outputs come directly from the outputs of one or more of the storage elements, as well as machines in which the outputs are a combinational function of the present state vector, the next state vector, and/or external inputs to the machine.

Some systems are designed using level-triggered storage elements such as latches, instead of edge-triggered storage elements such as flip-flops. In some of these systems, certain latches are transparent when the clock signal is high and opaque when the clock signal is low, and other latches are transparent when the clock signal is low and opaque when the clock signal is high. These systems require careful design to ensure that no race conditions can occur in which a change in the output of a transparent latch element propagates through combinational circuitry back to the input of the latch before the latch becomes opaque on the next clock transition.

Synchronous logic design has been used effectively for an extraordinary number of simple and complex systems. In integrated circuit design, a system may be incorporated onto one or more integrated circuit chips with the clock signal provided from an external source along a printed circuit board trace. As clock frequencies have increased, however, it has become more difficult to provide such a high frequency clock signal to the various chips. The problem is magnified on printed circuit boards because the traces begin to exhibit significant reactance at these frequencies.

In order to address this problem, some systems incorporate a phase lock loop (PLL)-based frequency doubler on-chip. Thus if the system on the chip is intended to operate at 50 MHz, for example, the external circuitry need only provide a 25 MHz clock signal which is then doubled by the PLL in order to generate the clock signal for the storage cells on the chip. The use of PLLs is disadvantageous, however, since they typically require the addition of a capacitor and a resistor off-chip, thereby increasing the component count and pin usage.

SUMMARY OF THE INVENTION

According to the invention, roughly speaking, a synchronous machine is designed using a double-edge triggered memory cell which updates its output on both the rising and falling edges of a clock input.

BRIEF DESCRIPTION OF THE DRAWINGS

The invention will be described with respect to particular embodiments thereof, and reference will be made to the drawings, in which.

DETAILED DESCRIPTION

Figure 1:
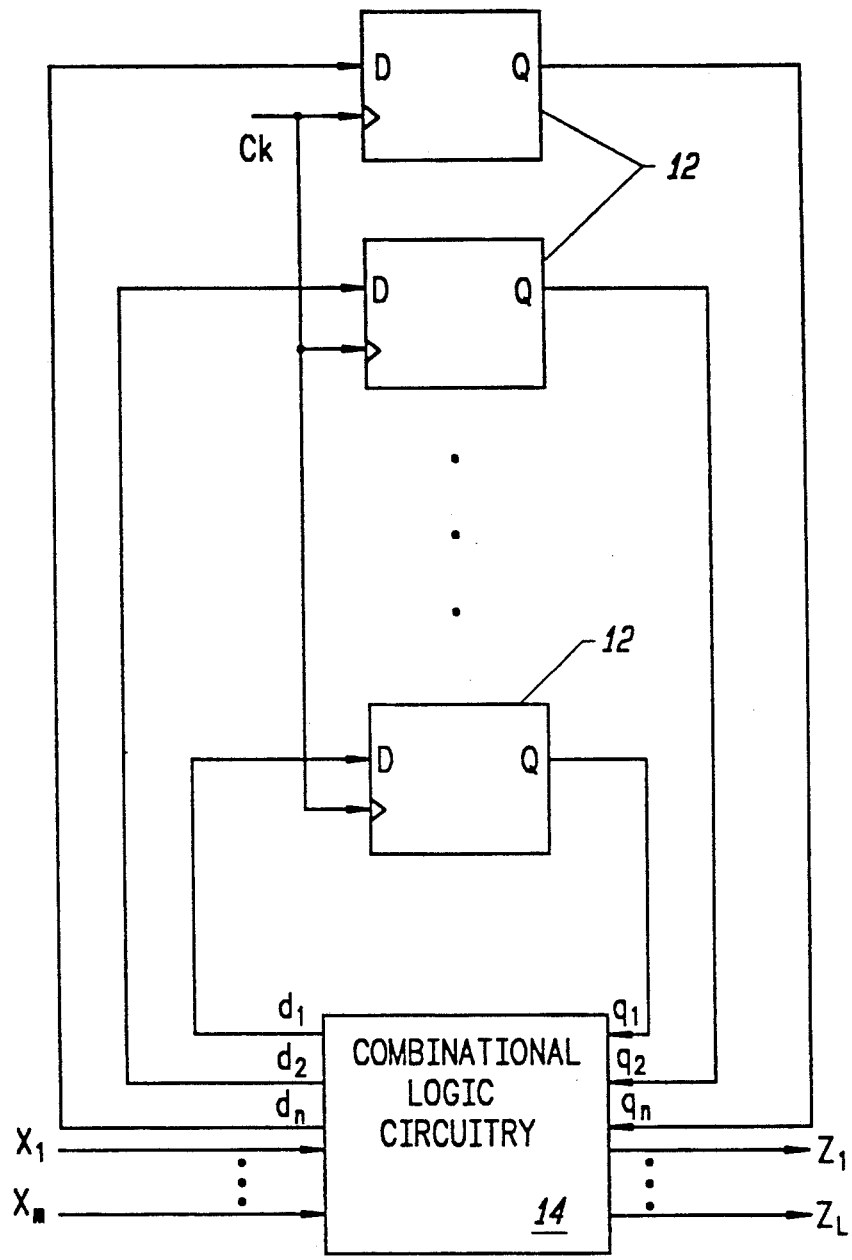
FIG. 1 is a block diagram of a model of a synchronous state machine.

FIG. 1 shows a block diagram of a model for a synchronous state machine. It comprises two basic portions: one or more storage cells 12, and combinational logic circuitry 14. Each of the storage cells 12 has a Q output, a clock input, and at least one data input. The storage cells in FIG. 1 are shown as D-type storage cells, for which each cell has a single data input D. It will be understood, however, that other types of storage cells may be used in the model.

The Q outputs of each of the storage cells 12 is connected to a respective $q_i$ input to the combinational logic circuitry 14, and the D input of each of the storage cells 12 is connected to receive a respective $d_i$ output of the combinational logic circuitry 14. The combinational logic circuitry 14 further has a plurality of external inputs $x_i$ and generates a plurality of external outputs $z_i$. The figure shows a total of n Q outputs being provided to the combinational logic circuitry 14 and the same number n outputs of the combinational logic circuitry 14 being provided back to the D inputs of the storage cells 12, but it will be understood that these two quantities need not be the same if some of the storage cells 12 are of a different type with a different number of data inputs. Similarly, FIG. 1 shows a total of l $z_i$ outputs, and m $x_i$ inputs. Since as used herein a combinational logic path can consist of a simple conductor, the model of FIG. 1 describes both the type of machine in which input signals are provided to the D inputs of the storage cells 12 either directly or via logic gates, and machines in which the $z_i$ outputs of the combinational logic circuitry 14 are provided either directly from the Q outputs of the storage cells 12 or via logic gates.

Figure 2:
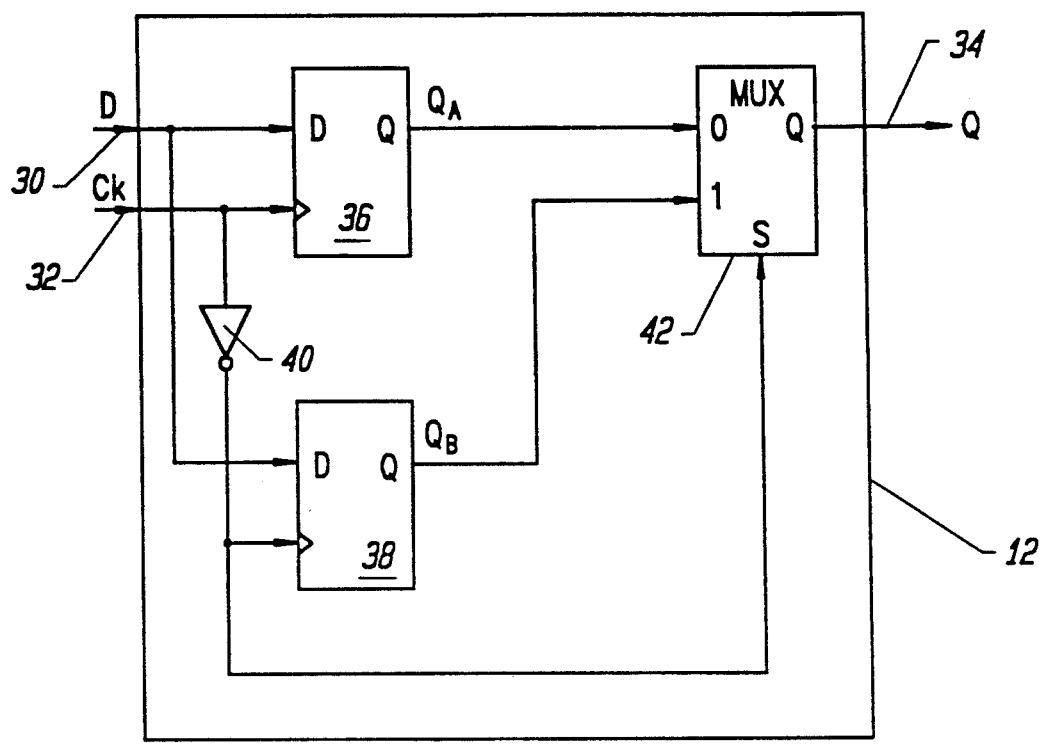
FIG. 2 is a logic level detail of one of the storage cells of FIG. 1.

FIG. 2 shows a logic level diagram of one of the storage cells 12 of FIG. 1. It will be understood that the individual logic blocks depicted in FIG. 2 need not be separate logic blocks in actual implementation, since delay and/or space savings may be achievable by combining some of the functions of different ones of these logic blocks together.

As mentioned with respect to FIG. 1, each storage cell 12 has a D input 30, a clock input 32 and a Q output 34. The D input 30 is connected to the D input of a conventional D flip-flop 36, and also to the D input of a conventional D flip-flop 38. The clock input 32 is connected to the clock input of the flip-flop 36, and via an invertor 40, to the clock input of the flip-flop 38. The Q output of flip-flop 36 (identified as $Q_A$) is connected to the "0" input of a multiplexer 42, and the Q output of the flip-flop 38 (identified as $Q_B$) is connected to the "1" input of the multiplexer 42. The output of invertor 40 is connected to the select ("S") input of the multiplexer 42, and the Q output of the multiplexer 42 is the Q output 34 of the storage cell 12. The flip-flops 36 and 38 are each rising edge-triggered flip-flops in this embodiment.

Figure 3:
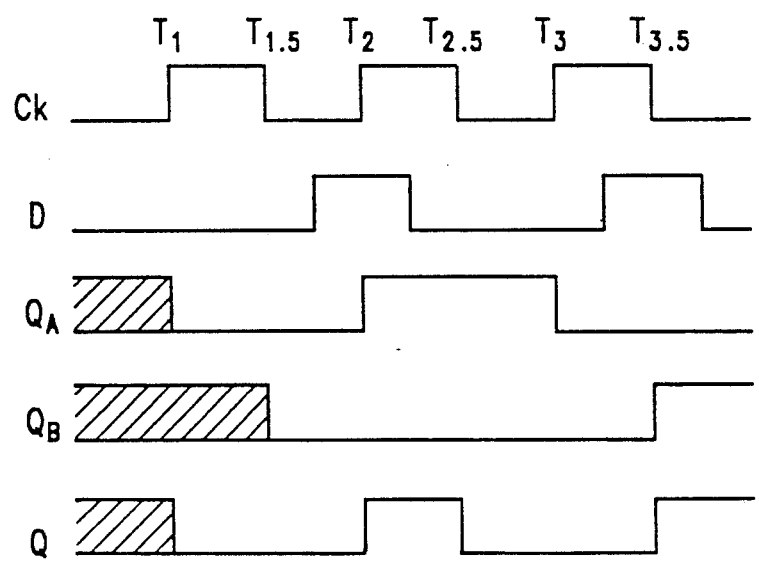
FIG. 3 is a timing diagram illustrating the operation of the cell of FIG. 2.

FIG. 3 is a timing diagram which may be used to understand the operation of the storage cell of FIG. 2. As shown in FIG. 3, assume that the clock signal arriving on line 32 (FIG. 2) is square wave having an alternating sequence of rising and falling edges. Furthermore, assume that a rising edge occurs in the clock signal at a time $T_1$. At that time $T_1$, assume that the signal on the D input 30 of the storage cell 12 is at a logic 0. Since both the clock and D signals are connected directly to the clock and D inputs of D flip-flop 36, the output of flip-flop 36 will change from its previous state to a logic 0 on the rising edge of the clock signal at $T_1$. This is shown on the timing diagram line labeled $Q_A$. As will be seen, the output $Q_A$ will not change again until the next rising edge at time $T_2$.

At time $T_{1.5}$, a falling edge of the clock signal arrives on line 32. This signal is inverted by invertor 40 and provided to the clock input of flip-flop 38, thereby causing the flip-flop 38 to load in the value on the D input 30 at time $T_{1.5}$. Again, assuming D is still at a logic 0 level at time $T_{1.5}$, the output $Q_B$ of flip-flop 38 will change to logic 0 at time $T_{1.5}$. This is reflected on the line labeled $Q_B$ on the timing diagram of FIG. 3.

Now assume that at some time after $T_{1.5}$ and before the next rising edge of the clock signal at $T_2$, the D input 30 to the storage cell 12 changes to a logic 1 and remains there until some time between $T_2$ and $T_{2.5}$. As shown in FIG. 3, this will be reflected in the $Q_A$ output of flip-flop 36 at time $T_2$ and will not be reflected in the $Q_B$ output of flip-flop 38 at all since no falling edge of the clock signal 32 arrives while the D input is high.

At time $T_{2.5}$, the clock signal 32 has a falling edge. The $Q_B$ output of flip-flop 38 does not change from a logic 0 at this time, since the D input 30 is now at a logic 0. At time $T_3$, the D input 30 is still at a logic 0, thereby loading a 0 into flip-flop 36. The next falling edge of the clock signal 30 occurs at time $T_{3.5}$, at which time the D signal 30 is high, and a logic 1 is loaded into the flip-flop 38 as shown on the $Q_B$ line of the timing diagram of FIG. 3.

This process continues with the Q output of flip-flop 36 changing in response to the level that the D input 30 is at when each rising edge of the clock signal 32 arrives, and the output $Q_B$ changing in response to the level that the D input is at when each falling edge of the clock pulse 32 arrives.

As shown in FIG. 2, the select input S of multiplexer 42 is connected to the output of invertor 40 and therefore receives the same inverted clock signal that is provided to the clock input of flip-flop 38. Thus, whenever the clock signal 32 is high, the multiplexer 42 will provide the signal $Q_A$ on the Q output 34 of the storage cell 12, and whenever the clock signal 32 is low, the multiplexer 42 will provide the signal $Q_B$ on the Q output 34 of storage cell 12. Accordingly, between time $T_1$ and time $T_{1.5}$, when the clock signal 30 is high, the Q output of storage cell 12 changes to reflect the value which $Q_A$ is changing to at that time. Between time $T_{1.5}$ and $T_2$, the multiplexer selects $Q_B$, which is also 0. Thus, as shown on the line labeled Q on the timing diagram of FIG. 3, the Q output 34 goes low at time $T_1$ and stays low until time $T_2$. Between times $T_2$ and $T_{2.5}$, the clock signal 30 is high, and the multiplexer 42 selects $Q_A$ onto the Q output 34. Since $Q_A$ is high at this time, Q also goes high at this time. Between times $T_{2.5}$ and $T_3$, the clock signal 32 is low and the multiplexer 42 selects $Q_B$. Since $Q_B$ is low at this time, the Q output 34 also goes low.

At time $T_3$, the clock signal 32 goes high again and the multiplexer 42 selects $Q_A$. But since $Q_A$ goes low at $T_3$, the Q output 34 of the storage cell 12 remains low until $T_{3.5}$. At that time, the multiplexer 42 selects $Q_B$ which has just gone high. The Q output 34 therefore goes high at time $T_{3.5}$.

It can be seen that the Q output 34 of the storage cell 12 can change on every half cycle of the clock signal 32, thus effectively doubling the frequency at which the state machine of FIG. 1 can operate relative to the frequency of the clock signal. It should be noted that the circuits which make up the flip-flops 36 and 38 and the multiplexer 42 should be designed carefully to minimize any switching transients which may occur.

Figure 4:
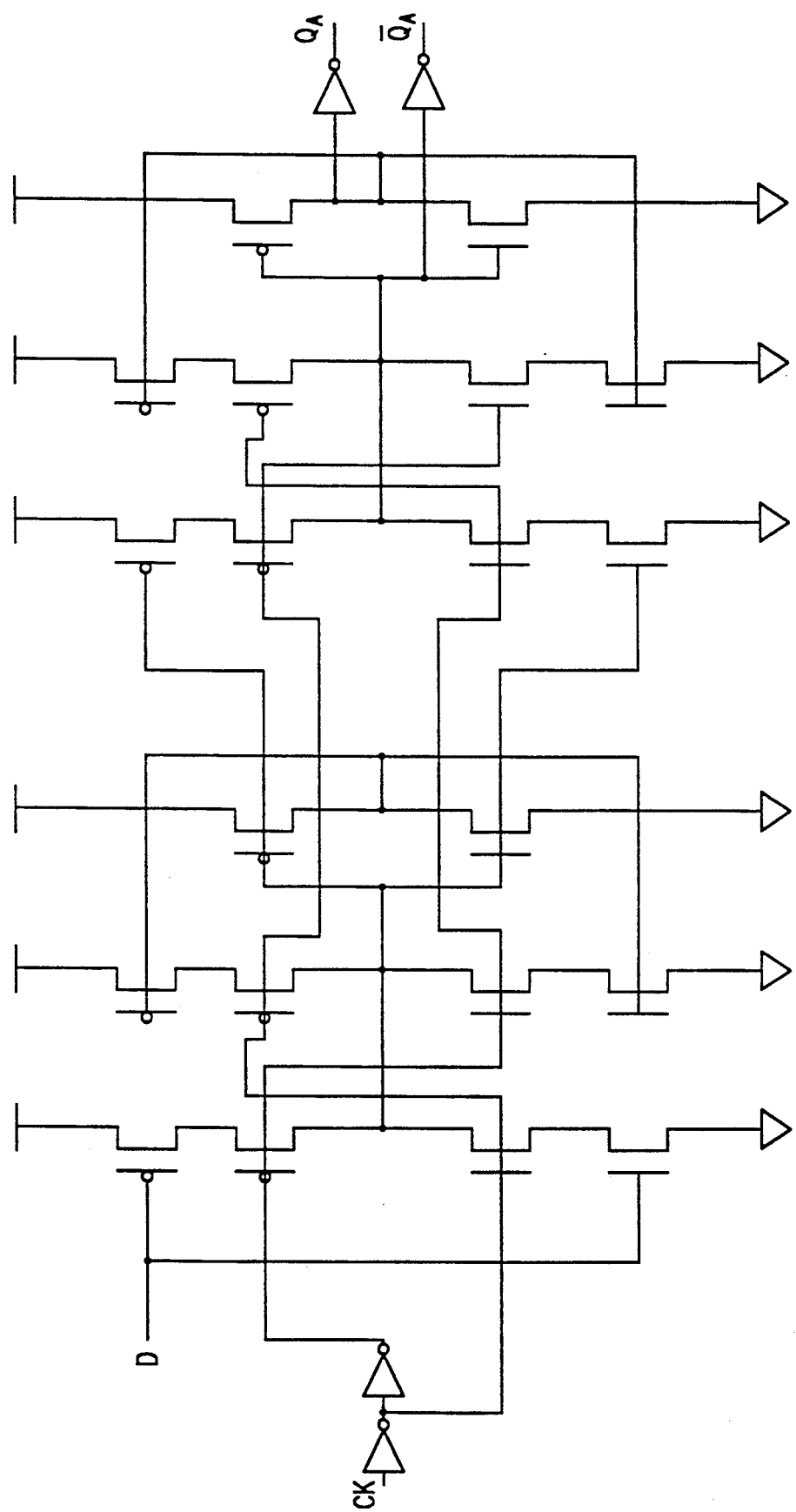
FIGS. 4 and 6 are transistor-level schematics of D flip-flops which may be used in the cell of FIG. 2.

FIG. 4 is a transistor level schematic diagram of a conventional "stacked invertor" type D flip-flop which may be used to implement the flip-flops 36 and 38 in FIG. 2. The operation of the circuitry of FIG. 4 is conventional and need not be explained herein.

Figure 5:
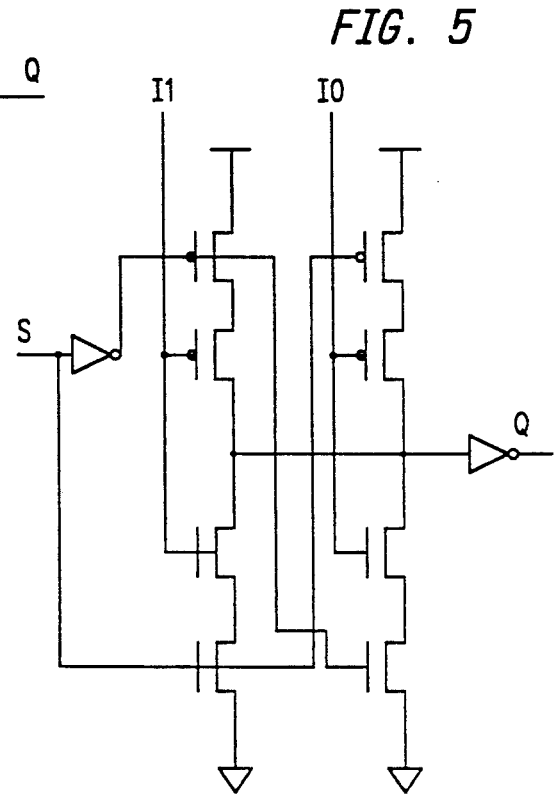

FIG. 5 is a transistor level schematic diagram of a conventional "stacked invertor" type multiplexer which may be used to implement the multiplexer 42 shown in FIG. 2. The operation of the circuitry of FIG. 5 is conventional and need not be explained herein.

Figure 7:
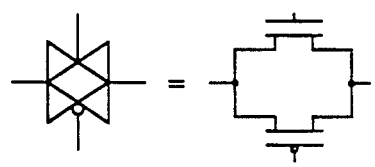
FIG. 7 defines a symbol used in FIG. 6.
Figure 6:
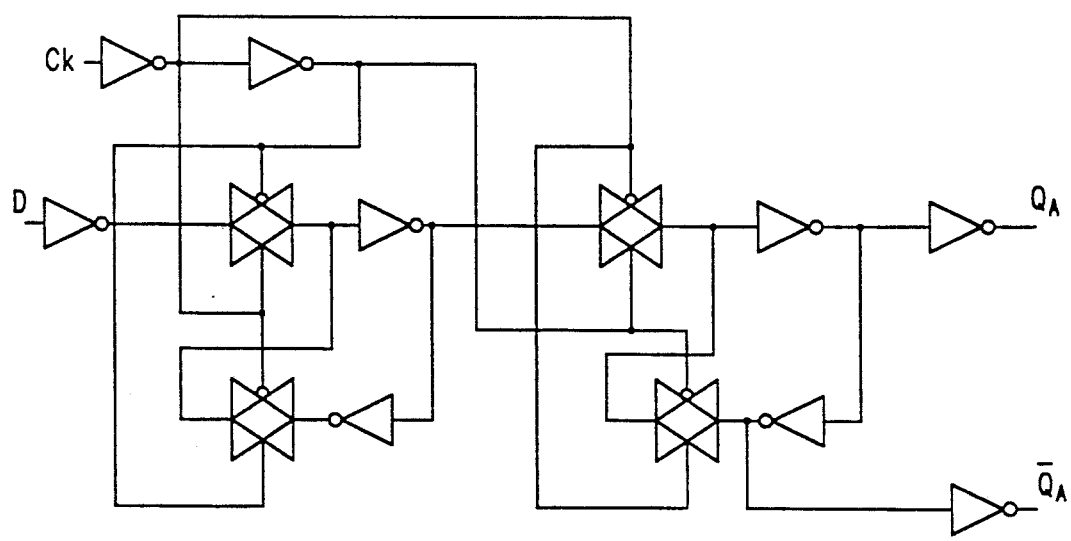

FIG. 6 is a transistor level schematic diagram of a conventional "pass gate" type flip-flop which may be used to implement the flip-flops 36 and 38 in FIG. 2. The operation of the circuitry of FIG. 6 is conventional and need not be explained herein. FIG. 7 illustrates the transistor makeup of the "pass gate" symbol used in FIG. 6.

Figure 8:
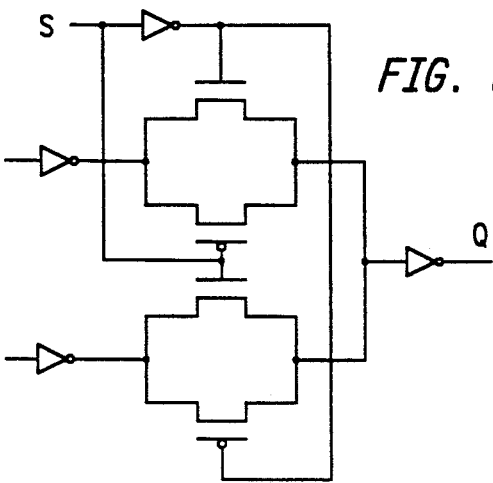
FIGS. 5 and 8 are transistor-level schematics of multiplexers which may be used in the cell of FIG. 2.

FIG. 8 is a transistor level schematic diagram of a conventional "pass gate" type multiplexer which may be used to implement the multiplexer 42 of FIG. 2. The operation of the circuitry of FIG. 8 is conventional and need not be explained herein.

As previously mentioned, the structure of the storage cell 12 at the transistor level may be optimized by merging some of the functions of the various logic level components shown in FIG. 2.

The invention has been described with respect to particular embodiments thereof, and it will be understood that numerous modifications are possible within its scope.

I claim:

1. A circuit, for use with an input set of at least one input signal, and a clock signal, said clock signal having a series of alternating rising and falling edge transitions, comprising:
   storage means for storing a logic state; and
   updating means for updating said logic state in response to the state which said input set is in at the time of each of said edge transitions in said clock signal;
   wherein said input set consists of a J input signal and a K input signal, wherein said logic state consists of a single binary bit O, and wherein said updating means leaves said logic state at its previous value if both said J and K signals are at a first predetermined binary value at the time of each given edge transition in said clock signal, complements the value of said logic state if both said J and K signals are at a second predetermined binary value at the time of each given edge transition in said clock signal, and updates the value of said logic state to the state that a predetermined one of said J and K input signals is in if said J and K signals are at opposite binary values at the time of each given edge transition in said clock signal.

2. A state machine, for use with a clock signal having a series of alternating rising and falling edge transitions, comprising:
   storage means for storing a present state vector having at least one element;
   next state means for providing a next state vector having at least one element; and
   updating means for updating each element of said present state vector in response to the contents of said next state vector at the time of each of said alternating edge transitions in said clock signal.

3. Apparatus according to claim 2, wherein said storage means comprises a plurality of storage cells, each having a D input and a Q output, each of said D inputs being coupled to receive one of said next state vector elements from said next state means, and each of said Q outputs carrying a respective element of said present state vector, and wherein said updating means updates the Q output of each given one of said cells to the state of the D input of said given one of said cells at the time of each of said edge transitions in said clock signal.

4. Apparatus according to claim 2, wherein said storage means comprises a plurality of storage cells, each having a J input, a K input and a Q output, said J and K inputs each being coupled to receive respective ones of said next state vector elements from said next state means, and each of said Q outputs carrying a respective element of said present state vector, and wherein said updating means leaves the Q output of each given one of said cells at its previous state if the J and K inputs of said given one of said cells are both at a first predetermined binary value at the time of each of said edge transitions in said clock signal, complements the value of the Q output of said given one of said cells if the J and K inputs to said given one of said cells are both at a second predetermined binary value at the time of each of said edge transitions in said clock signal, and updates the Q output of said given one of said cells to the state of a predetermined one of said J and K inputs if the i and K inputs to said given one of said cells are at opposite binary values at the time of each of said edge transitions in said clock signal.

5. Apparatus according to claim 2, wherein said next state means comprises combinational logic means for providing said next state vector at least partly in response to at least one of the elements of said present state vector.

6. Apparatus according to claim 5, for use further with an external input signal, wherein said next state means provides said next state vector further in response to said external input signal.

7. Apparatus according to claim 2, further comprising combinational output means for providing an output vector having at least one element, said output means providing said output vector at least partly in response to said present state vector.

8. Apparatus according to claim 7, for use further with an external input signal, wherein said output means provides said output vector further in response to said external input signal.

9. Apparatus for use with a clock signal having a series of alternating rising and falling clock edges, comprising:
   a plurality of storage cells, each having a Q output and at least one data input; and
   combinational means having a first output coupled to an input of a first one of said cells, a second output coupled to an input of a second one of said cells and a first input coupled to the Q output of one of said first and second cells,
   wherein each of said storage cells updates its output in response to the value on its data inputs at each of said alternating rising and falling clock edges.

10. Apparatus according to claim 9, wherein each of said storage cells comprises:
   first and second edge triggered flip-flops, each having a data input, a clock input and a Q output, the data input of each of said first and second flip-flops being coupled to receive the data input of said storage cell, each of said flip-flops updating its Q output in response to the state of its data input at the time of an effective edge transition on its clock input, the effective edge being the same for both of said first and second flip-flops;

means for coupling said clock signal to the clock input of said first flip-flop and the complement of said clock signal to the clock input of said second flip-flop; and means for providing to the Q output of said storage cell, the Q output of said first flip-flop during the level of said clock signal immediately following each occurrence of said effective edge in said clock signal, and the Q output of said second flip-flop during the level of said clock signal immediately following each occurrence of the edge in said clock signal opposite said effective edge.

11. Apparatus, for use with a clock signal having a series of alternating rising and falling clock edges, comprising:

a plurality of storage cells, each having a Q output and at least one data input; and combinational means having a first input coupled to the Q output of a first one of said cells, a second input coupled to the Q output of a second one of said cells and a first output coupled to one of said inputs of one of said first and second cells, wherein each of said storage cells updates its output in response to the value on its data inputs at each of said alternating rising and falling clock edges.

12. Apparatus according to claim 11, wherein each of said storage cells comprises:

first and second edge triggered flip-flops, each having a data input, a clock input and a Q output, the data input of each of said first and second flip-flops being coupled to receive the data input of said storage cell, each of said flip-flops updating its Q output in response to the state of its data input at the time of an effective edge transition on its clock input, the effective edge being the same for both of said first and second flip-flops;

means for coupling said clock signal to the clock input of said first flip-flop and the complement of said clock signal to the clock input of said second flip-flop; and means for providing to the Q output of said storage cell, the Q output of said first flip-flop during the level of said clock signal immediately following each occurrence of said effective edge in said clock signal, and the Q output of said second flip-flop during the level of said clock signal immediately following each occurrence of the edge in said clock signal opposite said effective edge.

13. A method for operating a state machine, comprising the steps of:

updating a present state vector in response to a next state vector on each rising edge of a clock signal; and updating said present state vector in response to said next state vector on each falling edge of said clock signal.

* * * * *